United States Patent [19]
Guthrie et al.

[11] Patent Number: 6,119,920
[45] Date of Patent: *Sep. 19, 2000

[54] METHOD OF FORMING AN ELECTRONIC PACKAGE WITH A SOLDER SEAL

[75] Inventors: Frank E. Guthrie, Rockwall; Paul O. Johnson, Allen, both of Tex.

[73] Assignee: RF Monolithics, Inc., Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/770,268

[22] Filed: Dec. 20, 1996

[51] Int. Cl.⁷ ............................................. B23K 1/00
[52] U.S. Cl. ................................. 228/123.1; 228/124.6; 228/56.3; 228/245; 228/214
[58] Field of Search ............................. 228/124.6, 123.1, 228/56.3, 245, 214, 219, 220, 234.2

[56] References Cited

U.S. PATENT DOCUMENTS

| | | | |
|---|---|---|---|
| 4,639,631 | 1/1987 | Chason et al. | 310/344 |
| 4,737,742 | 4/1988 | Takoshima et al. | 333/150 |
| 4,937,006 | 6/1990 | Bickford et al. | 228/219 |
| 5,111,277 | 5/1992 | Medeiros, III et al. | 357/74 |
| 5,237,235 | 8/1993 | Cho et al. | 310/313 R |
| 5,303,457 | 4/1994 | Falkner et al. | 29/25.35 |
| 5,341,980 | 8/1994 | Nishikawa et al. | 228/205 |
| 5,448,014 | 9/1995 | Kong et al. | 174/52.3 |
| 5,459,368 | 10/1995 | Onishi et al | 310/313 R |
| 5,736,783 | 4/1998 | Wein et al. | 257/691 |

OTHER PUBLICATIONS

G.K. Montress et al., "A Miniature Hybrid Circuit Saw Oscillator Using an All Quartz Packaged Resonator", 1985, *Ultrasonic Symposium.*, pp. 277–282.

Paul A. Dawson et al., "An Undersea Fiber–Optic Regenerator Using an Integral–Substrate Package and Flip–Chip Saw Mounting", Nov. 1984, *IEEE Journal*, from an article entitled "Selected Areas in Communications", vol. SAC–2, No. 6, pp. 966–971.

*Primary Examiner*—Patrick Ryan
*Assistant Examiner*—M. Alexandra Elve
*Attorney, Agent, or Firm*—Novakov Davis, P.C.

[57] ABSTRACT

A method of attaching a lid with at least a metallic surface thereon to a substrate to enclose a surface acoustic wave electronic circuit using a fluxless solder preform having an undesired oxide surface and associated with the metallic surface on the lid and in superimposed and abutting relationship with a gold seal ring surrounding the electronic circuit to form a unit that is heated in a furnace having a hydrogen atmosphere such that the hydrogen removes any undesired oxide surfaces from the solder preform and the metallic surface on the lid by combining with the oxygen therein to form moisture so as to remove any oxide surfaces from the solder preform and the lid metallic surface and enable a complete bonding of the fluxless solder preform with the gold seal ring and the lid metallic surface thereby forming a hermetically sealed package.

20 Claims, 4 Drawing Sheets

TYPICAL SEAL PROFILE

METHOD OF FORMING AN ELECTRONIC PACKAGE WITH A SOLDER SEAL

BACKGROUND OF THE INVENTION

1. Field of the Invention

The present invention relates generally to electronic circuit packages and in particular to an electronic circuit package including a lid covering an electronic circuit, the lid being attached to a solderable seal ring around the electronic circuit with a fluxless solder preform having an undesired oxide surface by use of a hydrogen atmosphere that, when heated, reacts with the undesired oxide on the solder and on any other metal surfaces thus reducing and removing the oxide layer and allowing the lid to be sealed to the substrate using solder.

2. Description of Related Art Including Information Disclosed Under 37 CFR 1.97 and 1.98

Surface-mounted packages for electronic circuits are well known in the art. They generally include an electronic component, a plurality of leads, and a specially configured housing that encloses and protects the electronic component. The outer ends of the leads generally extend adjacent the lower edge of the housing for physical contact with corresponding solder pads on a printed circuit board during solder reflow.

When such electronic packages are required to be hermetically sealed the lids are generally welded to the base to form the hermetic seal and create the package. Thus in U.S. Pat. No. 4,737,742 a package is formed from a printed circuit board and a cover bonded to the board through a spacer that hermetically seals the surface of the board on which the SAW devices are installed. The cover consists of a ceramic plate. The spacer is an adhesive made from glass, resin, or the like.

In U.S. Pat. No. 4,639,631, metal areas on a base are electrostatically sealed to corresponding glass surfaces on a cover to create a hermetic seal for a surface acoustic wave device.

In an article in the 1985 *Ultrasonic Symposium* entitled "A Miniature Hybrid Circuit SAW Oscillator Using an All Quartz Packaged Resonator", by G. K. Montress et al., beginning with page 277, a miniature SAW resonator oscillator was disclosed in which the entire oscillator is contained within a volume of only 0.25 cubic inch. In that case, the SAW device was formed on a substrate and the matching quartz cover placed over and spaced from the substrate by a glass frit. Exposed bus bars have leads attached from them to the printed circuit board on which the device is placed.

In another article in the 1984 *IEEE Journal* on "Selected Areas in Communications",Volume SAC-2,No. 6,November 1984,beginning with page number 966, an article by Paul A. Dawson et al., entitled "An Undersea Fiber-Optic Regenerator Using an Integral-Substrate Package and Flip-Chip SAW Mounting" disclosed a novel method of mounting SAW filters and designated the mounting as a "flip-chip" that used a thick-film substrate as the base of the package. A lid was then laser welded to the base to form a hermetic seal and create the package.

In U.S. Pat. No. 5,111,277, a package is formed and sealed with a metallic cover preferably Kovar or another metal having a coefficient of thermal expansion approximately equal to that of the ceramic frame. The metallic cover is bonded to a seal ring manufactured from low expansion metals such as Kovar by a method such as seam welding. In seam welding, arc or resistance welding produces a series of overlapping spot welds which form a continuous, hermetic seal.

Special problems occur in attempting to design a hermetically sealed package for a surface acoustic wave device. Various types of resonators with glass containers have been suggested such as, for example, set forth in U.S. Pat. No. 4,639,631. The packages disclosed comprise two halves which are made of glass, or glass and ceramic, and have a recess in one half for receiving a quartz resonator. Such glass packages are bonded together about their periphery by means of a eutectic metal, such as solder. A hermetic seal is formed about the periphery of such a package due to the melting of the deposited eutectic material. However, depositing a eutectic material having a relatively low melting point about the periphery of each half of the glass package may require an intermediate layer of a different material since the desired eutectic material may not directly adhere to the glass.

A solder with a flux paste has been used in the past to package some electronic circuits in a hermetically sealed package. However, such combination of solder and flux cannot be used in forming hermetically sealed packages for surface acoustic wave devices that are sensitive to mass loading, inasmuch as the flux, upon the melting of the solder, can engage the electrode fingers of the surface acoustic wave devices and thus change their electrical operating characteristics. Thus, many other methods have been attempted to be used as described earlier to form hermetically sealed packages for surface acoustic wave devices.

A fluxless solder cannot be used to seal metallic packages together if it has an oxide coating on the surface of the solder and/or the packages. It is also known that placing such fluxless solder in a hydrogen environment at the proper temperature will cause the hydrogen to react with the oxygen in the undesired oxide coating to produce moisture and leaving the fluxless solder and/or package with a clean surface for bonding.

Further, the use of prior art welding of metal lids to a substrate requires a metal lid having an upper portion forming a lip for welding that increases the thickness of the lid. Also, a metallic lid containing gold can be sealed to a gold seal ring but obviously the resulting product is very expensive.

It would be advantageous to have a hermetically sealed package for a surface acoustic wave device that would be economical to produce through the use of a fluxless solder having an undesired oxide surface, that can be manufactured in volume production, that does not impact the electrical operating characteristics of the SAW device, is robust but economical to form and can absorb a great deal of shock, and provides a Faraday shield for the surface acoustic wave device.

SUMMARY OF THE INVENTION

In the present invention, a plurality of surface acoustic wave (SAW) electronic circuits can be formed in an array on a substrate with electrodes extending to the bottom thereof for surface mounting. An "electronic circuit", as used herein, is defined as a SAW device with or without additional circuit components. Surrounding each of the electronic circuits on the substrate is a solderable seal ring, preferably made of gold. A lid fixture having a matrix array of recesses for receiving a plurality of solderable lids is loaded with the solderable lids. The solderable lids may be metallic or non-metallic having a second solderable seal ring thereon that corresponds to the shape of the solderable seal ring about the electronic circuit to be enclosed. Each lid has a fluxless solder preform associated with the periphery thereof. The term "fluxless solder", as used herein, means a fluxless solder having an undesired oxide surface coating thereon. The solder preforms and corresponding lid metal surfaces may have a shape for mating with a corresponding one of the seal rings surrounding each electronic circuit. The substrate is then inverted and placed in superimposed relationship with the lid fixture so as to arrange each of the fluxless solder preforms in superimposed abutting relationship with a corresponding one of the solderable seal rings and the lid metal oxide surface. By placing the resulting package in a furnace having a hydrogen atmosphere and heating the atmosphere, the solder preform and corresponding lid metal oxide surfaces combine with the hydrogen to form moisture and leave substantially oxide-free bonding surfaces. The fluxless solder melts and bonds to the solderable seal ring to sealingly attach the solderable lids over corresponding ones of the SAW circuits on the substrate and form a plurality of electronic circuit packages. The individual circuit packages can then be sawn apart from the substrate and separated into individual packages as is well known in the art.

In like manner, of course, an individual electronic package can be formed instead of an array of packages. A single electronic circuit can be formed on a substrate surrounded by a solderable seal ring. A lid has a metallic surface associated therewith and a solder preform is associated with the lid metallic surface. The substrate may be inverted and placed on the lid such that the solderable seal ring, the lid metallic surface, and the solder preform are in superimposed abutting relationship. The unit is placed in the hydrogen atmosphere and heated to form the circuit package.

To provide a Faraday shield, each of the SAW circuits may have a ground terminal and the solderable seal ring, preferably of gold, is electrically connected to the ground terminal. In addition, the lid must be entirely of metal and the fluxless solder preform is attached to the periphery of each of the lids by any well-known manner such as by spot welding. Thus, when the metal lid is bonded to the solderable seal ring, the metal lid is also at ground potential.

Finally, the sealing atmosphere includes a minimum of 10% hydrogen with the remaining gas being inert such as nitrogen.

Thus it is an object of the present invention to provide an electronic package for a surface acoustic wave device that is economical to manufacture in volume quantities through the use of a fluxless solder (having an undesired oxide surface) to bond a metal cap or non-metallic lid to the substrate around each SAW circuit.

It is another object of the present invention to matingly align a plurality of electronic SAW circuits, each of which is surrounded by a gold seal ring, in superimposed abutting relationship with a like plurality of metal lids with a fluxless solder preform, having an undesired oxide surface, in mating arrangement with the gold seal ring, and a metal surface on the lid, the resulting package being heated in a furnace having a hydrogen atmosphere until the preform and any lid oxides combine with the hydrogen to create both a metal bonding surface and moisture, the solder melting and bonding to the gold seal ring and the lid metal surface to sealingly attach each lid to a corresponding one of the SAW circuits on the substrate and create a hermetically sealed package. If the lid is formed entirely of metal, a Faraday shielded package may be formed.

It is yet another object of the present invention to provide a hydrogen atmosphere having at least 10% hydrogen and remaining gas inert such as nitrogen.

Thus the present invention relates to a method of simultaneously attaching a plurality of lids, each having at least a partial metallic surface, to a like plurality of SAW circuits on a common substrate to form a plurality of hermetically sealed SAW circuit packages that can be separated into individual packages. The method comprises the steps of forming a plurality of SAW circuits on a substrate in a predetermined pattern array, each of the SAW circuits including a metal seal ring, such as gold, surrounding the SAW circuit, arranging a like plurality of lids in a lid fixture in a corresponding predetermined pattern array, each of the lids having at least a metallic surface about its periphery, associating a fluxless solder preform with the periphery of each of the lids, the solder preforms and lid metallic surface having an undesired oxide layer thereon and having a shape for mating with a corresponding one of the metal seal rings, such as gold, placing the substrate in superimposed relationship with the lid fixture so as to arrange each of the fluxless solder preforms in superimposed abutting relationship with a corresponding one of the gold seal rings and lid metallic surface, and heating the superimposed substrate and lid fixture in a furnace having a hydrogen atmosphere until the preform oxide surface and any other metal oxide surfaces combine with the hydrogen to create a metal bonding surface and the solder melts and bonds to the gold seal ring to sealingly attach each lid to a corresponding one of the SAW circuits on the substrate.

BRIEF DESCRIPTION OF THE DRAWINGS

These and other features of the present invention will be more fully disclosed when taken in conjunction with the following DETAILED DESCRIPTION OF THE PREFERRED EMBODIMENTS in which like numerals represent like elements and in which.

DETAILED DESCRIPTION OF THE PREFERRED EMBODIMENTS

Figure 1:
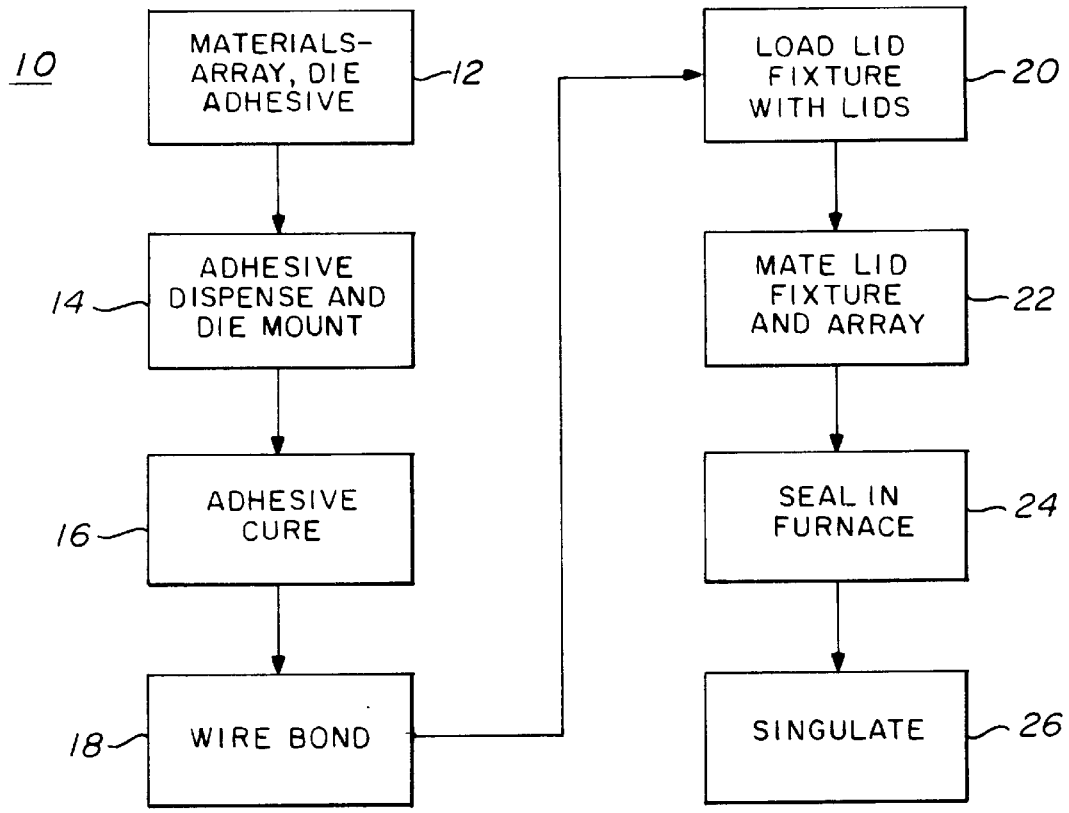
FIG. 1 is flow chart representing the novel process of the present invention.

FIG. 1 is a flow chart of the inventive process 10 of the present invention for forming an array of packages. It should be understood that a single electronic circuit package could be made using the identical process except for forming an array. The first four steps 12, 14, 16, and 18 are old and well known in the art. In step 12 the array, die, and adhesive are prepared for commencement of the process. In step 14, the surface acoustic wave circuits are die mounted with an adhesive to the substrate. At step 16 the adhesive is cured and at step 18 wire bonds are formed from the device to the terminals for surface mounting. At step 20, however, a lid fixture is loaded with lids that are to be mounted over the corresponding surface acoustic wave circuits and hermetically sealed to the substrate. The lids may be entirely of metal or non-metallic, such as ceramic, with a solder seal ring formed about the periphery of the lid. Also associated with the periphery of each of the lids is a fluxless solder preform that will be shown hereafter. It is to be placed between the lid and the substrate in any well-known manner such as by spot welding to the lid.

Figure 2:
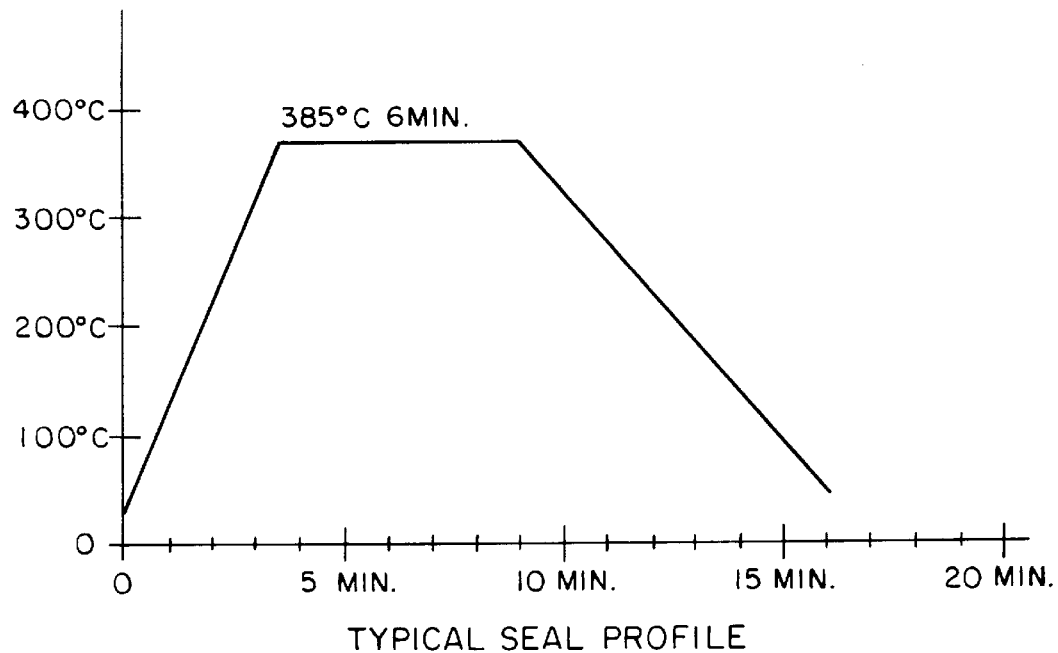
FIG. 2 is a graph of a typical seal profile indicating the temperature and time of heating the package in the furnace having the hydrogen atmosphere to create a hermetic seal on the package.

At step 22, the surface acoustic wave array is inverted and superimposed over the lid fixture such that each fluxless solder preform, having an undesired oxide surface, is in superimposed relationship with and abuts the gold solder ring that surrounds each of the surface acoustic wave circuits. At step 24 the superimposed unit is placed in a furnace that has a hydrogen atmosphere in which the hydrogen reacts with the oxygen in any oxide surfaces to form moisture and clean metal surfaces for bonding. During the elevation of the temperature in the furnace, the clean solder melts and bonds the gold seal ring, about the surface acoustic wave circuit, to the Ni plating on the lid so as to form a hermetically sealed package. At step 26 a well-known cutting device such as a diamond saw is used in a well-known manner to separate each of the circuits from the others. FIG. 2 is a graph of a typical seal profile that is used with the present invention to bring about the formation of a hermetically sealed package utilizing a fluxless solder. As stated earlier, solders that are associated with flux cannot be used since, during heating and melting of the solder, the flux vaporizes and redeposits inside the package and coats the surface acoustic wave device electrode fingers thus causing a mass loading of the fingers and changing the electrically operating characteristics of the circuit. With the present process, with the hydrogen combining with the oxygen in the oxide surface to form moisture, the oxide surface is removed from the fluxless solder and from other metal surfaces and the clean solder makes a good solid bonding connection between the lid and the gold seal ring around each electronic circuit. It will be noted in FIG. 2 that it takes approximately 10 minutes±6 minutes at a temperature of 385°±20° C. attained in the furnace to form a sealed package depending upon the type of solder used. At approximately 309° C. a solder having a composition of 97.5% Pb, 1.57% Sn, and 1.0% Ag melts. Solders with other compositions melt at different temperatures. At approximately 350° the hydrogen combines with the oxygen in the oxide surfaces on the fluxless solder to form moisture and a clean metal surface according to the equation $$M_xO_y + yH_2 \rightarrow yH_2O + xM$$

and forms a bond with the gold seal ring about the surface acoustic wave electronic circuit and the metal lid. Because there is such a small amount of oxygen the moisture is negligible. It is allowed to maintain a temperature of 385°±20° C. for approximately 10±6 minutes to ensure sufficient oxide removal and complete bonding and then the heat is decreased over the next seven minutes whereupon the array is removed from the furnace and is separated into its individual circuit elements as is well known in the art as for instance by using a well-known cutting device. The preferred temperature for the particular solder set forth above is 385° C. and the preferred time in the furnace is 6 minutes.

Figure 3A:
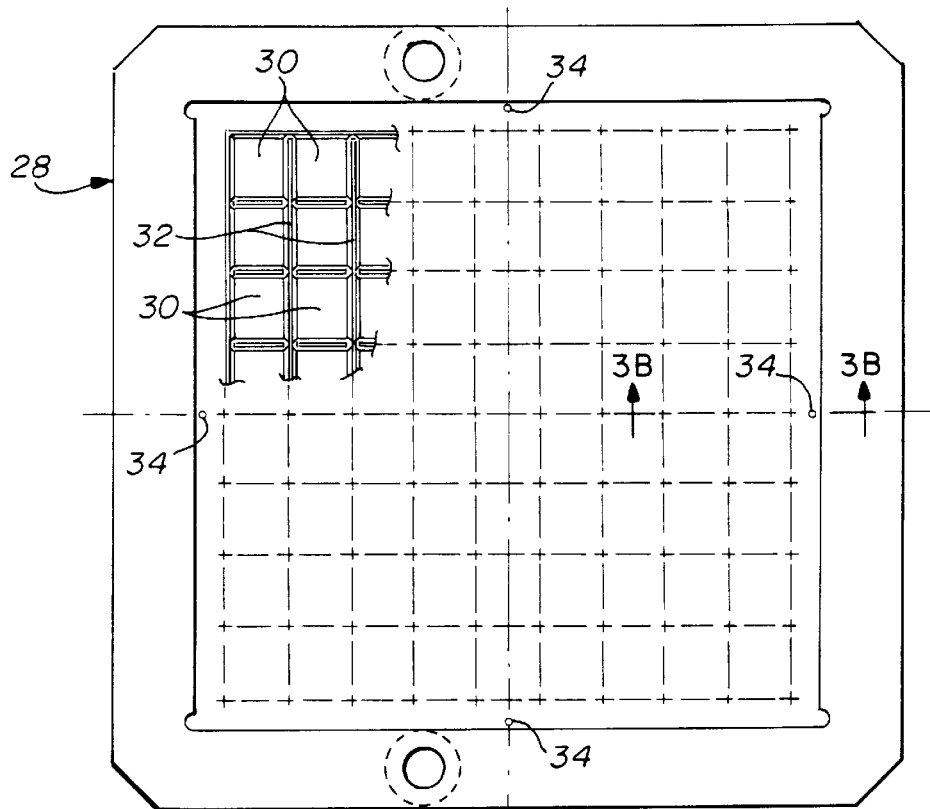
FIG. 3A is a plan view of the lid fixture indicating the array of recesses in which lids are placed for corresponding mating with the substrate having the SAW circuits thereon.
Figure 3B:
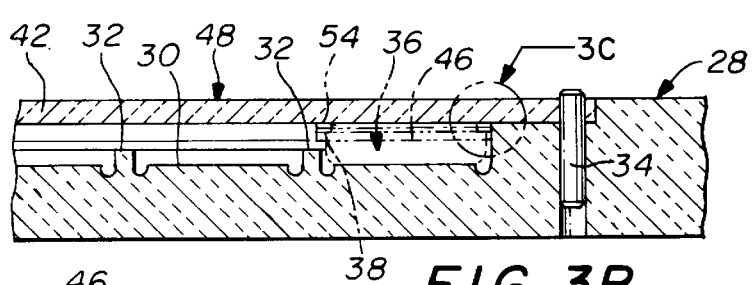
FIG. 3B is a partial cross section of the array taken along lines 3B—3B in FIG. 3A.
Figure 3C:
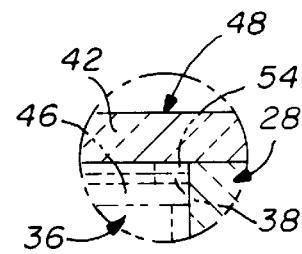
FIG. 3C is an enlarged view of a portion of FIG. 3B.
Figure 4B:
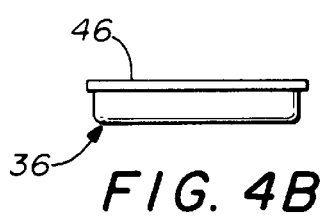
FIG. 4B is an end view of the metal lid illustrating the solder preform that is attached to the periphery of the underside thereof.
Figure 4A:
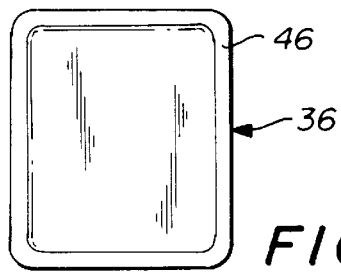
FIG. 4A is a top view of the metal lid that is to be attached to the substrate to form the hermetically sealed container.
Figure 6:
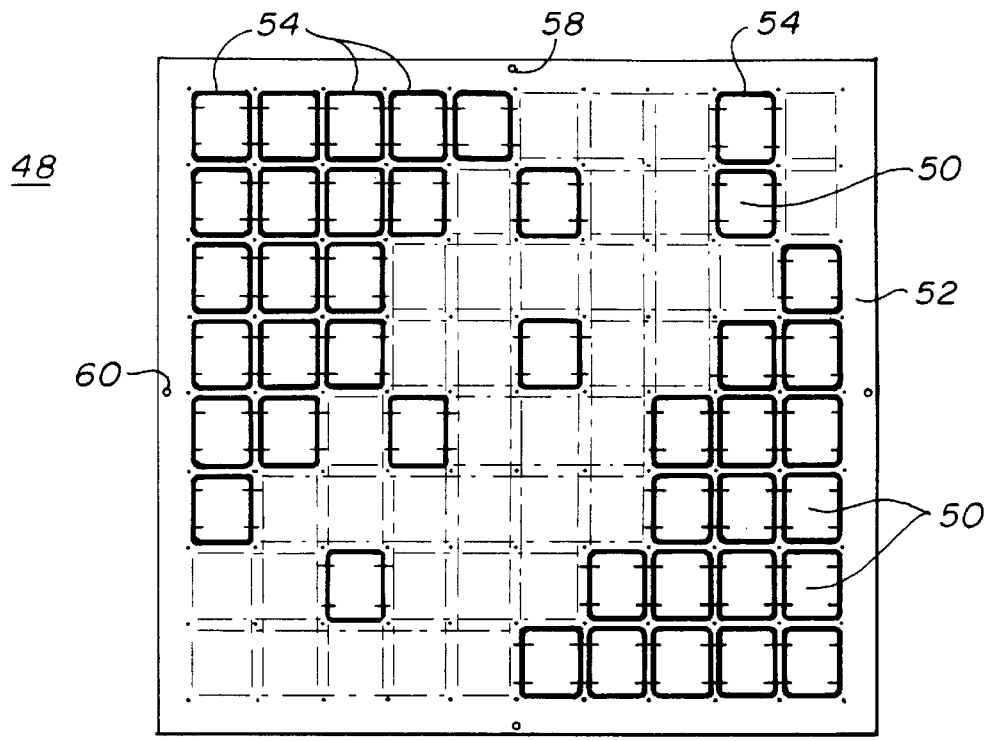
FIG. 6 is a top view of the substrate illustrating the array of surface acoustic wave circuits thereon with each surface acoustic wave circuit being surrounded by a metal seal ring such as gold.

FIG. 3A is a top view of a lid fixture 28 having a plurality of recesses 30 in which the metal lids 36 that are to be used to form the hermetically sealed packages are placed. An enlarged view of the upper left-hand corner of the lid fixture is shown and illustrates the recesses 30 each separated by a projection 32 to keep the lids 36 separated from each other. As can be seen in FIG. 3B, alignment pins 34 are provided in the lid fixture to properly align it with corresponding orifices or notches 58 in the substrate as shown in FIG. 3A and FIG. 6 hereafter. A lid 36 is shown in phantom lines in FIG. 3B to be inserted in one of the recesses 30. It has an outer periphery 46 (see FIG. 4A and FIG. 4B) on which the fluxless solder preform 38 rests. See details in the enlarged view of a portion of FIG. 3B in FIG. 3C. When the lid fixture 28 is mounted in superimposed relationship with the circuit array 48 shown in FIG. 6, the substrate 52 rests in plane 42 (FIG. 3B) such that its seal ring 54 is in superimposed abutting relationship with the fluxless solder preform 38. As stated previously, when the combined lid fixture 28 and circuit array 48 are placed in the furnace at an elevated temperature, the chemical reaction of the hydrogen with the oxygen in the surface oxide of the fluxless solder preform removes the undesired oxide in the form of moisture and leaves a clear metal surface. The solder having melted at 309° C. wets the Ni plating on the lid at 350° C. and forms a bond with the gold seal ring 54. FIG. 4A is a top view of one of the novel lids 36. FIG. 4B shows the flange 46 forming the periphery thereof and with which the solder preform 38 is associated. If the cap 36 is metal and the fluxless solder preform is metal, they can be attached together in any well-known manner such as by spot welding.

Figure 5A:
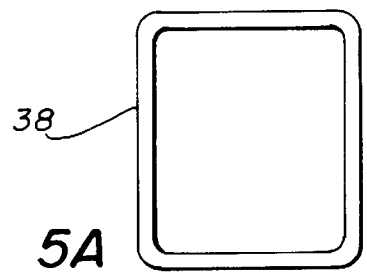
FIG. 5A is a plan view of the fluxless solder preform that is used with a metal lid as illustrated in FIG. 4B
Figure 5B:
FIG. 5B is an end view thereof.

The solder preform 38 is illustrated in plan view FIG. 5A and in end view in FIG. 5B. It is composed of 97.5% lead, 1.5% tin, and 1.0% silver. It has a thickness approximately 0.005±0.001 inches and thus is very thin as shown in FIG. 5B. It has a width of 0.020±0.002 inches typically. Thus it will be noted that the undesired oxide layer on all metal surfaces is very thin and, when the undesired oxide thereon reacts with the hydrogen to form water or $H_2O$, very little moisture is generated but the undesired oxide is substantially removed so that a good and complete bond can be made with the gold seal ring and the metal surface on the lid 36.

As stated earlier, the lid 36 may be formed entirely of metal or may be formed of non-metallic material, such as ceramic, with the flange 46, or periphery, only, having a metallic surface formed thereon that can be sealed to the gold seal ring 54 and the solder preform 38.

The substrate array 48 with the surface acoustic wave circuits 50 thereon is illustrated in top view in FIG. 6. In FIG. 6, it can be seen that a plurality of surface acoustic wave circuits 50 are placed in a well-known manner on the substrate 52. The substrate 52 may be formed of a ceramic material. It will be noted that a gold seal ring 54 surrounds each of the circuits 50.

Figure 7:
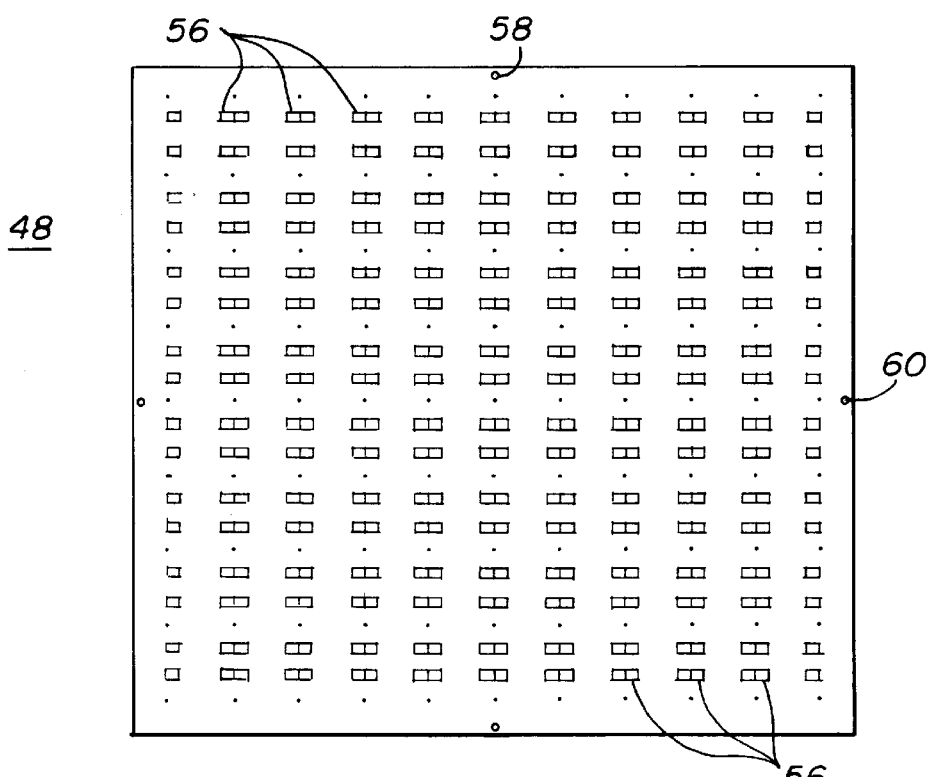
FIG. 7 is a bottom view of the substrate illustrating the connections thereon for surface mounting.

FIG. 7 is a plan view of the bottom side of the substrate array 48 illustrating the connections 56 thereon which are used for surface mounting the electronic circuit packages after they have been individually separated from each other. It will be noted that in the side edges of the substrate 52, orifices 58 and 60 are formed for alignment with pins in a fixture to make sure that the gold seal rings 54 are in accurate alignment and abutting with the fluxless solder preforms 38 when the substrate array 48 is inverted and placed on the lid fixture 28 in mating relationship.

Figure 8:
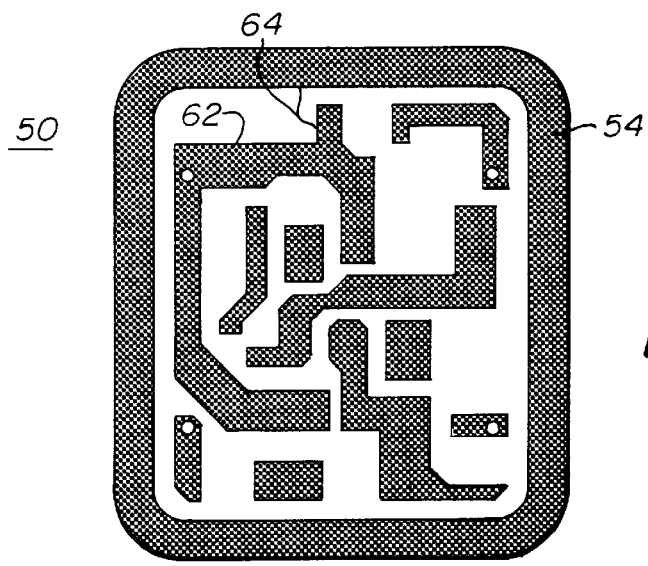
FIG. 8 is a detailed enlarged view of the surface acoustic wave circuit that is formed on the substrate as illustrated in FIG. 6 and FIG. 7.

FIG. 8 is an enlarged view of an individual one of the surface acoustic wave electronic circuits 50. The gold seal ring 54 is shown surrounding the circuit. If desired, a ground plane 62 forming part of the SAW circuit can be connected to the gold seal ring 54 by means of a connection 64. Thus when a metal lid or cap 36 is sealingly attached to the gold seal ring 54 by means of the fluxless solder preform 38, a Faraday shielded package will be created because the metal lid or cap 36 will be at the same potential as some of the mounting pads on the bottom side. Then, when one of these pads is tied to ground, the lid will be grounded.

Figure 9:
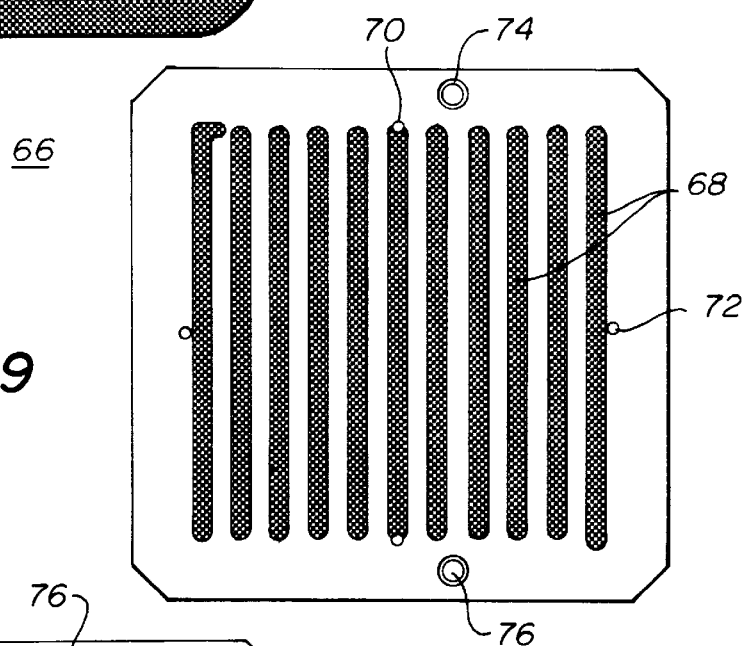
FIG. 9 is a plan view of a bottom plate to be placed under the bottom surface of the substrate shown in FIG. 7 so that the substrate can be tipped over and placed in a jig to automatically and properly align it with the lid fixture shown in FIG. 3A.
Figure 10:
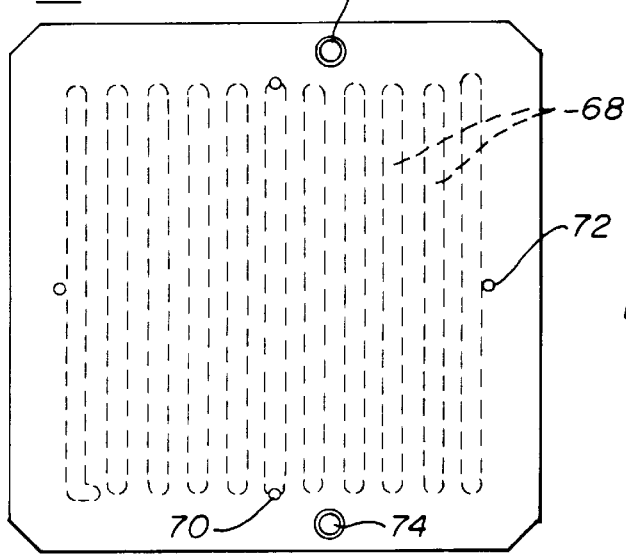
FIG. 10 is a bottom view of the bottom plate shown in FIG. 9.

When the substrate array 48 is inverted and placed in superimposed relationship over the lid fixture 28, a bottom plate 66 shown in FIG. 9 is placed on top of the superimposed substrate array 48 and lid fixture 28 and the entire unit is placed in a holding fixture while the unit moves into the furnace. The bottom plate 66 has elongated substantially rectangular recesses 68 that enable the hydrogen gas mixture to circulate freely to each of the circuits to ensure sufficient removal of the oxide layer from the fluxless solder preform and other metal surfaces. Again, orifices 70 and 72 and pins 74 and 76 allow the components of the entire unit to be accurately aligned with each other and held in a fixed relationship with each other during the soldering process or bonding process in the furnace. FIG. 10 is a bottom view of the bottom plate shown in FIG. 9.

Thus there has been disclosed a novel process for creating a hermetically sealed package for surface acoustic wave circuits wherein the package may or may not form a Faraday shield and wherein a fluxless solder preform, having an undesired oxide surface, is used such that the units can be produced either singly or in mass production in a manner that does not impact adversely the electrical operating characteristics of the surface acoustic wave device, and produces a robust but economically formed seal inasmuch as the unit can take a great deal of shock without damage to the unit. Further, the package may form a Faraday shield. In addition, the package is smaller in thickness than the typical package having a ceramic lid inasmuch as the ceramic has to be formed with additional height to provide a surface for welding or otherwise attaching the lid to the substrate.

The corresponding structures, materials, acts, and equivalents of all means or step plus function elements in the claims below are intended to include any structure, material, or act for performing the function in combination with other claimed elements as specifically claimed.

What is claimed is:

1. A method of simultaneously attaching a plurality of solderable lids to a like plurality of surface acoustic wave circuits on a common substrate to form a plurality of SAW circuit packages that can be separated into individual packages, the method comprising the steps of:

forming a plurality of SAW circuits on a substrate in a predetermined pattern array, each of said SAW circuits having a solderable seal ring surrounding said circuit;

arranging a like plurality of said solderable lids in a lid fixture in a corresponding predetermined pattern array, each of said solderable lids having at least a solderable peripheral flange;

providing a like plurality of solder preforms each having an undesired oxide layer thereon and that has a shape for mating with corresponding ones of said solderable seal rings and said solderable peripheral lid flange;

placing said substrate in superimposed relationship with said lid fixture so as to arrange each of said fluxless solder preforms in superimposed abutting relationship with a corresponding one of said solderable seal rings and solderable peripheral lid flanges; and heating said superimposed substrate and lid fixture in a furnace having a reducing atmosphere until any undesired oxide layer in said preform, seal ring, or solderable lid flange combines with said reducing atmosphere to create substantially oxide-free bonding surfaces and said solder melts and bonds to said solderable seal ring and solderable lid to sealingly attach said solderable lids over and around corresponding ones of said SAW circuits on said substrate.

2. A method as in claim 1 further comprising of the step of attaching each of said fluxless solder preforms to said periphery of a corresponding one of said lids in a fixed relationship.

3. A method as in claim 1 further comprising of the step of heating said superimposed substrate and lid fixture in said furnace in a hydrogen reducing atmosphere to form said oxide-free bonding surfaces.

4. A method as in claim 1 further comprising of the steps of:

forming a ground terminal on each of said surface acoustic wave circuits; and electrically connecting said ground terminal on each of said SAW circuits to a corresponding one of said solderable seal rings such that when said lid is soldered to said solderable seal ring, a Faraday shielded package is formed.

5. A method as in claim 1 wherein said step of heating comprises the step of heating said superimposed substrate and said lid fixture to a temperature greater than approximately 350° C.

6. A method as in claim 5 further including a step of heating said superimposed substrate and lid fixture in said furnace at 385°±20° C. for 10±6 minutes to react said hydrogen with said oxygen in said undesired oxide surfaces according to the equation

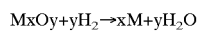

$$M_xO_y + yH_2 \rightarrow xM + yH_2O$$

thereby removing the oxide from said fluxless solder preform and solderable lid and enabling the fluxless solder preform to adhere to said solderable seal ring and solderable lid.

7. A method as in claim 6 further including the step of adhering said melted solder to said solderable seal ring and solderable lid to form a hermetically sealed package.

8. A method as in claim 1 further including the step of forming said solderable seal ring from gold alloy.

9. A method as in claim 1 further comprising the step of forming said hydrogen atmosphere of a minimum of 10% hydrogen and 90% nitrogen.

10. A method of hermetically enclosing a SAW circuit comprising the steps of:

forming a SAW circuit on a ceramic substrate;

surrounding the SAW circuit with a gold seal ring on said ceramic substrate;

associating a fluxless solder preform with a solderable lid used to cover said SAW circuit;

at least said fluxless solder preform having an undesired oxide coating thereon and a shape for mating with said gold seal ring;

placing said solderable lid over said SAW circuit with said solder preform in superimposed abutting relationship with said gold seal ring to form an electronic circuit package; and heating said electronic circuit package in a furnace having a reducing atmosphere until any undesired oxide coatings combine with said reducing atmosphere to create substantially oxide-free bonding surfaces, said solder melting and attaching to said gold seal ring to sealingly attach said solderable lid to said substrate and form a hermetically sealed electronic circuit package.

11. A method as in claim 10 further comprising the step of attaching said fluxless solder preform to said solderable lid in a fixed relationship prior to placing said solderable lid on said substrate.

12. A method as in claim 10 further comprising the step of heating said electronic circuit package in said furnace in a hydrogen atmosphere to form said oxide-free bonding surfaces.

13. A method as in claim 10 further comprising the step of forming said solderable lid entirely of metal.

14. A method as in claim 13 further comprising the steps of:

forming a ground terminal on said SAW circuit; and electrically connecting said ground terminal on said SAW circuit to said gold seal ring such that when said metal lid is soldered to said gold seal ring a Faraday shield is formed for said circuit package.

15. A method of hermetically enclosing a SAW circuit comprising the steps of:

forming a SAW circuit on a ceramic substrate;

surrounding the SAW circuit with a gold seal ring on said ceramic substrate;

associating a fluxless solder preform with a solderable lid used to cover said SAW circuit;

at least said fluxless solder preform having an undesired oxide coating thereon and a shape for mating with said gold seal ring;

placing said solderable lid over said SAW circuit with said solder preform in superimposed abutting relationship with said gold seal ring to form an electronic circuit package; and heating said electronic circuit package in a furnace having a reducing atmosphere to a temperature greater than approximately 350° C. until any undesired oxide coatings combine with said reducing atmosphere to create substantially oxide-free bonding surfaces, said solder melting and attaching to said gold seal ring to sealingly attach said solderable lid to said substrate and form a hermetically sealed electronic circuit package.

16. A method as in claim 15 further including the step of heating said circuit package in said furnace at 385°±20° C. for 10±6 minutes to react said hydrogen with oxygen in said undesirable oxide according to the equation

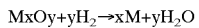

$$MxOy + yH_2 \rightarrow xM + yH_2O$$

thereby removing the undesirable oxide and enabling the fluxless solder to adhere to said solderable lid and gold seal ring.

17. A method as in claim 10 further comprising the steps of:

forming said solderable lid of a non-metallic material;

forming a solderable ring on said peripheral flange to make said lid a solderable lid; and attaching each of said fluxless solder preforms to said peripheral flange of said lid.

18. A SAW circuit package formed in accordance with the method set forth in claim 1.

19. A SAW circuit hermetically sealed in accordance with the method set forth in claim 10.

20. A SAW circuit hermetically sealed in accordance with the method set forth in claim 15.

* * * * *